United States Patent [19]
Johnson et al.

[11] Patent Number: 5,568,444
[45] Date of Patent: Oct. 22, 1996

[54] ADJACENT ROW SHIFT REDUNDANCY CIRCUIT HAVING SIGNAL RESTORER COUPLED TO PROGRAMMABLE LINKS

[75] Inventors: Larry D. Johnson, San Jose; David J. Pilling, Los Altos Hills, both of Calif.

[73] Assignee: Integrated Device Technology, Inc., Santa Clara, Calif.

[21] Appl. No.: 485,673

[22] Filed: Jun. 7, 1995

Related U.S. Application Data

[63] Continuation-in-part of Ser. No. 2,775, Jan. 8, 1993, Pat. No. 5,508,969.
[51] Int. Cl.[6] ........................................ G11C 8/00
[52] U.S. Cl. ................ 365/230.06; 365/200; 365/225.7; 365/198; 365/189.08; 365/230.08
[58] Field of Search ................................ 365/200, 225.7, 365/198, 189.08, 230.06, 230.08

[56] References Cited

U.S. PATENT DOCUMENTS

| | | | |
|---|---|---|---|
| 4,689,494 | 8/1987 | Chen et al. | 327/525 |
| 5,265,054 | 11/1993 | McClure | 365/200 |
| 5,301,153 | 4/1994 | Johnson | 365/200 |

*Primary Examiner*—David C. Nelms
*Assistant Examiner*—Andrew Q. Tran
*Attorney, Agent, or Firm*—Skjerven, Morrill, MacPherson, Franklin & Friel

[57] ABSTRACT

A redundancy circuit for a semiconductor memory device utilizes a fuse ladder comprising alternating programmable resistive fuses and signal restorers connected to one another in series. The signal restorers coupled between the fuses prevent the formation of a high impedance resistive line with a floating node when one of the fuses in the ladder is blown.

23 Claims, 13 Drawing Sheets

ADJACENT ROW SHIFT REDUNDANCY CIRCUIT HAVING SIGNAL RESTORER COUPLED TO PROGRAMMABLE LINKS

This application is a continuation-in-part of application titled "ADJACENT ROW SHIFT REDUNDANCY CIRCUIT HAVING SIGNAL RESTORER COUPLED TO PROGRAMMABLE LINKS", application Ser. No. 08/002,775 filed Jan. 8, 1993, now U.S. Pat. No. 5,508,969.

FIELD OF THE INVENTION

This invention relates to semiconductor memory devices. More particularly, this invention relates to a memory device with redundant memory cells.

BACKGROUND

Semiconductor memory devices are well-known in the prior art. Memory cells are generally configured into arrays of rows and columns as shown in FIG. 1. As shown in FIG. 1, a column of memory cells comprises a number of cells which share a pair of common bit lines, such as column 3 which shares bit lines $B_3$ and $\overline{B_3}$. Each pair of bit lines accesses the true and complement data stored in a selected one of the memory cells within a column. Similarly, a row of memory cells comprises cells sharing a common word line. Each word line selects a row of memory cells to be accessed by the bit lines.

Semiconductor manufacturing techniques for fabricating memory devices have improved tremendously over the last two decades resulting in increased yields. However, a higher level of integration, i.e. a larger number of elements of smaller sizes, is also achieved over the same period. Yields have approached but not achieved the theoretically possible target of 100%. At the same time, design techniques are increasingly being used to compensate for manufacturing flaws and to further improve yields.

In semiconductor memories, some of the design techniques involve providing redundant memory cells on the devices and redirecting the addressing circuitry to configure the redundant cells in place of the defective memory cells. Consequently, many defective memory devices can be transformed into fully operable memory devices. Various ways of addressing these redundant cells in place of defective cells have been implemented.

A conventional way of implementing memory cell redundancy is to provide "row redundancy" with one or more redundant rows of memory cells. In one such method, each redundant row is equipped with programmable links, such as fuses, so that a redundant row can be programmed into the address location of a defective row. These fuses have to be individually programmed for each replacement row location and a complex mapping algorithm is necessary to locate the appropriate fuses to be blown.

An alternative solution which avoids the above complex mapping problem uses "column redundancy". Squads, each comprised of a small fixed number of columns of memory cells, generally about four columns to a squad, are organized into groups. The number of squads in each group is limited to four to six (with four to six corresponding fuses in series). Each group of squads is associated with a redundant squad. Such a redundant squad contains the same number of columns as a regular squad and can be shifted in to replace a defective squad (with one or more defective columns) within the group. Hence, one-sixth to one-quarter of the total number of memory cells are redundant. As a result, this redundant squad column solution does not allow for the minimization of the total number of redundant cells required to fix the relatively small number of defective memory cells in a typical semiconductor device. A "squad column redundancy" circuit is shown in FIG. 2. Note the resistive ladder of fuses 20, 30, . . . coupled between a logic high voltage source (Vcc) and a fuse ground circuit.

A second "row redundancy" method, called "adjacent row redundancy", appears to solve both the complex mapping problem and the redundant cell minimization problem. To use this method, a fairly large number of rows of memory cells are organized into groups. In a typical memory device, there may be 128 to 256 rows in each group. Here, a redundant row is provided for each group of rows. A prior art circuit for accomplishing row shift redundancy comprises a resistive fuse ladder, one end of which is tied to power, the other end of which is tied to ground. Any fuse in the ladder could be severed at the point where the shift would begin within a group of rows.

A major difficulty associated with the "adjacent row redundancy" method is the long string of fuses required, since 128 or 256 rows would require 128 to 256 fuses in series. Typically, each fuse adds about 250 Ohms to the total series resistance of the resistor string. This results in possible resistive degradation of the programmed level and/or capacitive coupling into the high impedance fuse line that could introduce circuit malfunction. In practice, the length of the resistive fuse ladder is limited by the cumulative series resistance and the capacitance of the series of fuses 20, 30, . . . 70, 80, 90 as represented in FIG. 3.

FIG. 4 shows an adjacent row redundancy circuit having a long resistive ladder of programmable fuses. When there is a defective row, one of the fuses in the resistive ladder such as 20, 30, 40, 50, . . . or 90 is blown to provide the replacement redundant row. In a typical device, a portion of the resistive fuse ladder comprises a number of fuses equal in number to at least half the number of rows, i.e. at least 64 or 128 fuses in series. Although one end of this portion of the resistive fuse ladder is connected to either node 59 at Vcc or to node 60 at fuse ground, the other end of this portion of the fuse ladder is now floating. The result is a high impedance line highly susceptible to resistive and/or capacitive coupling.

SUMMARY OF THE INVENTION

In accordance with this invention, prior art difficulties arising from the cumulative series resistance of the programmable links in the resistive fuse ladder and which limit the number of rows in each memory array are overcome by coupling signal restorers into the long resistive ladder. The signal restorers regenerate the signal level at each stage between the programmable links, thereby eliminating potentially indiscriminate signal levels at the shift stages.

DETAILED DESCRIPTION

Figure 1:
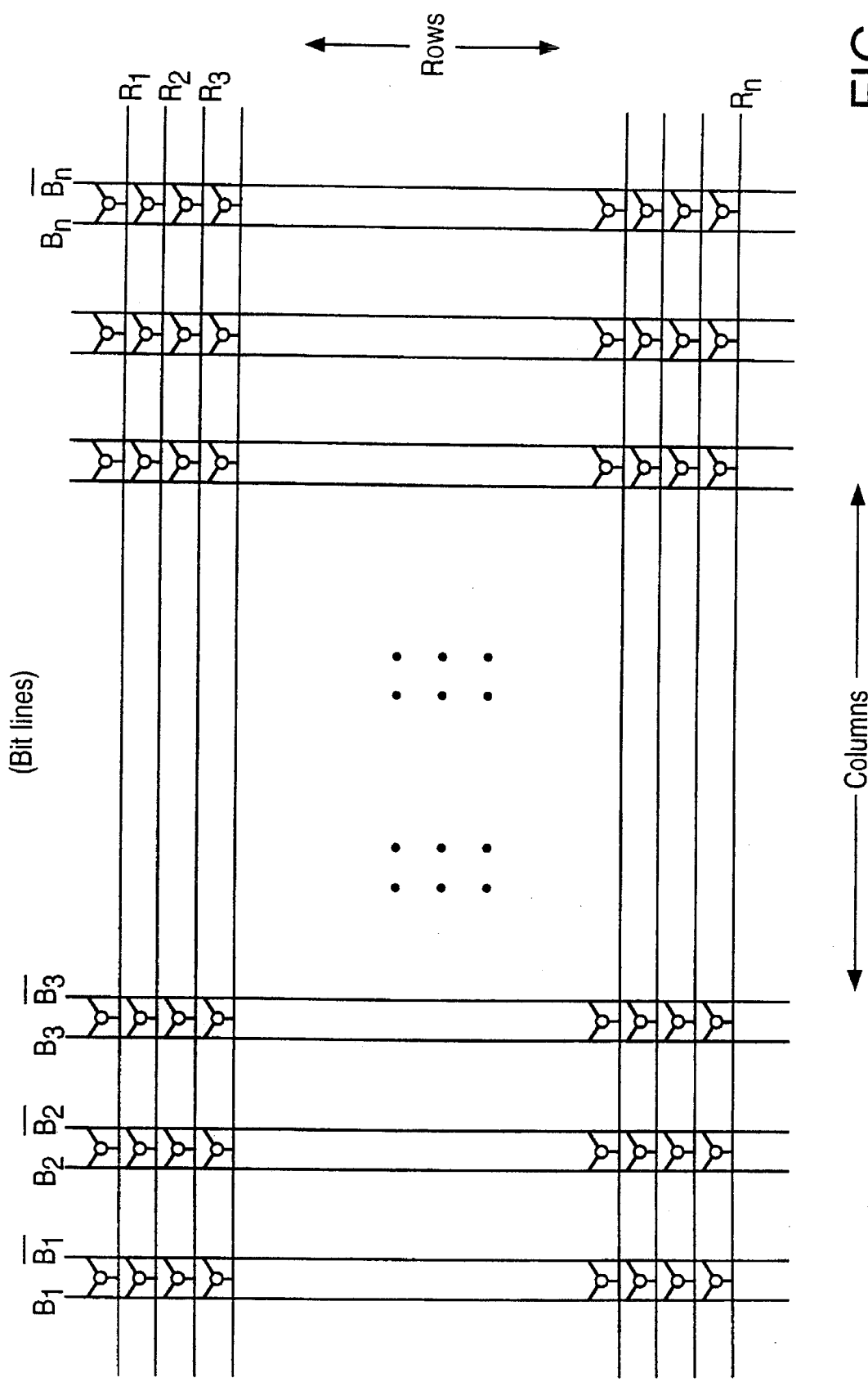
FIG. 1 (PRIOR ART) shows a memory configured into rows and columns.
Figure 2:
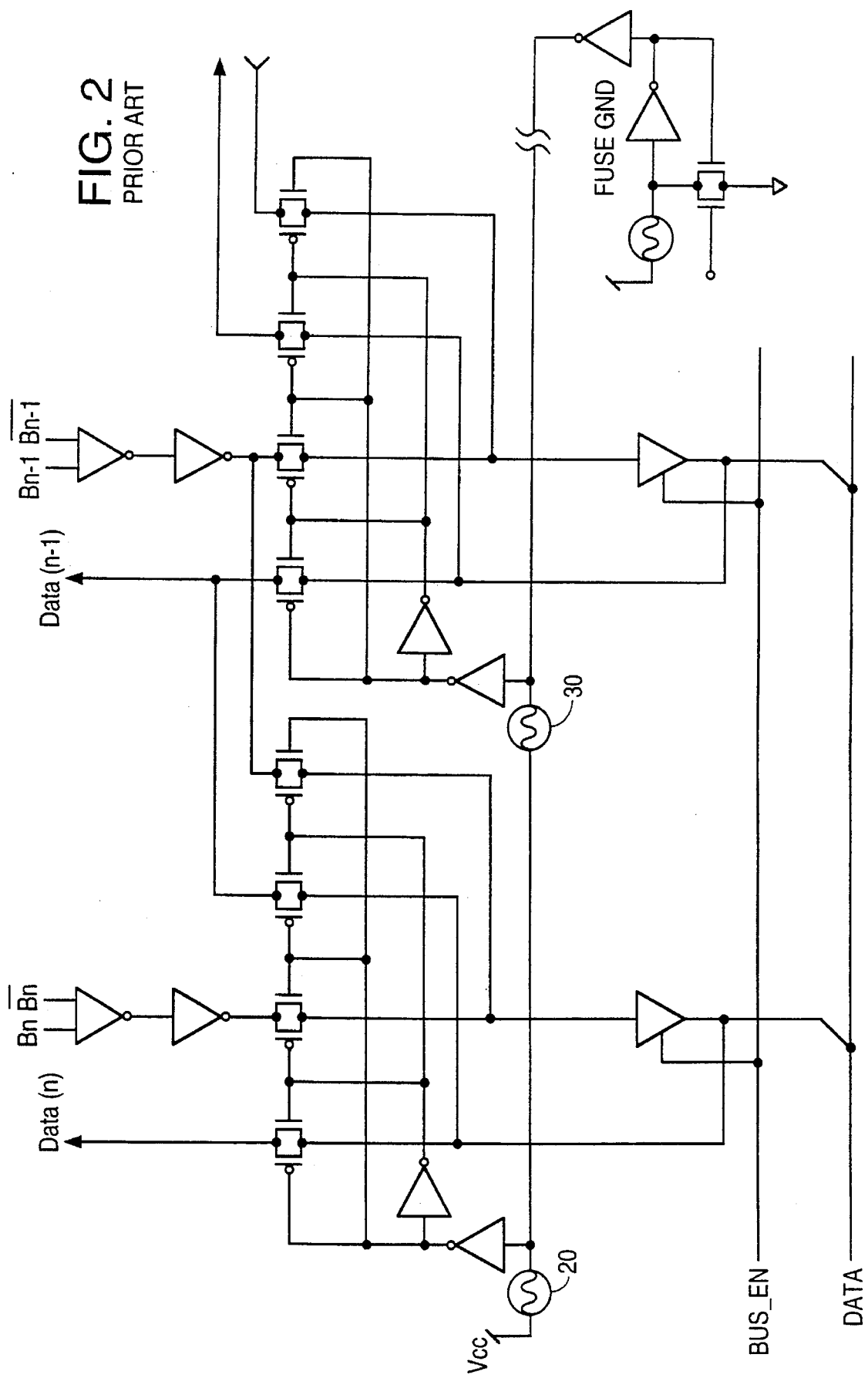
FIG. 2 (PRIOR ART) shows a squad column shift redundancy circuit.
Figure 3:
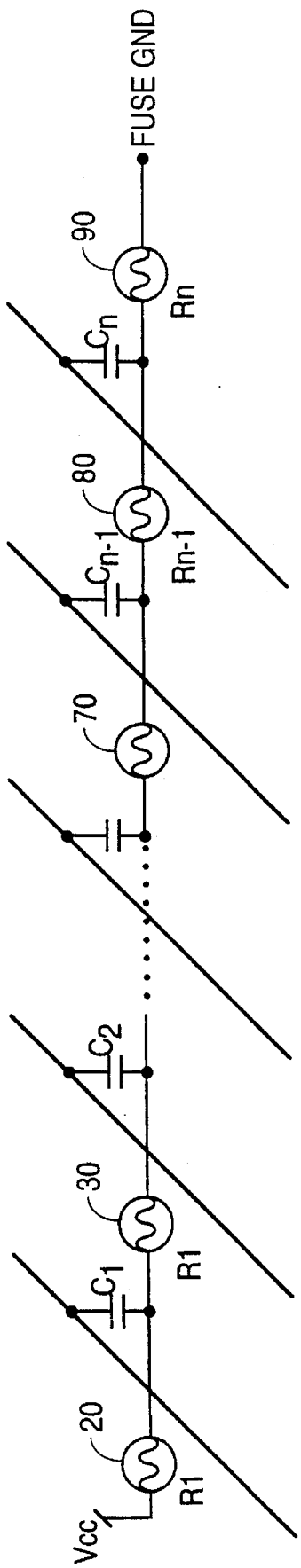
FIG. 3 (PRIOR ART) illustrates a resistive fuse ladder having series resistance and capacitive coupling.
Figure 4:
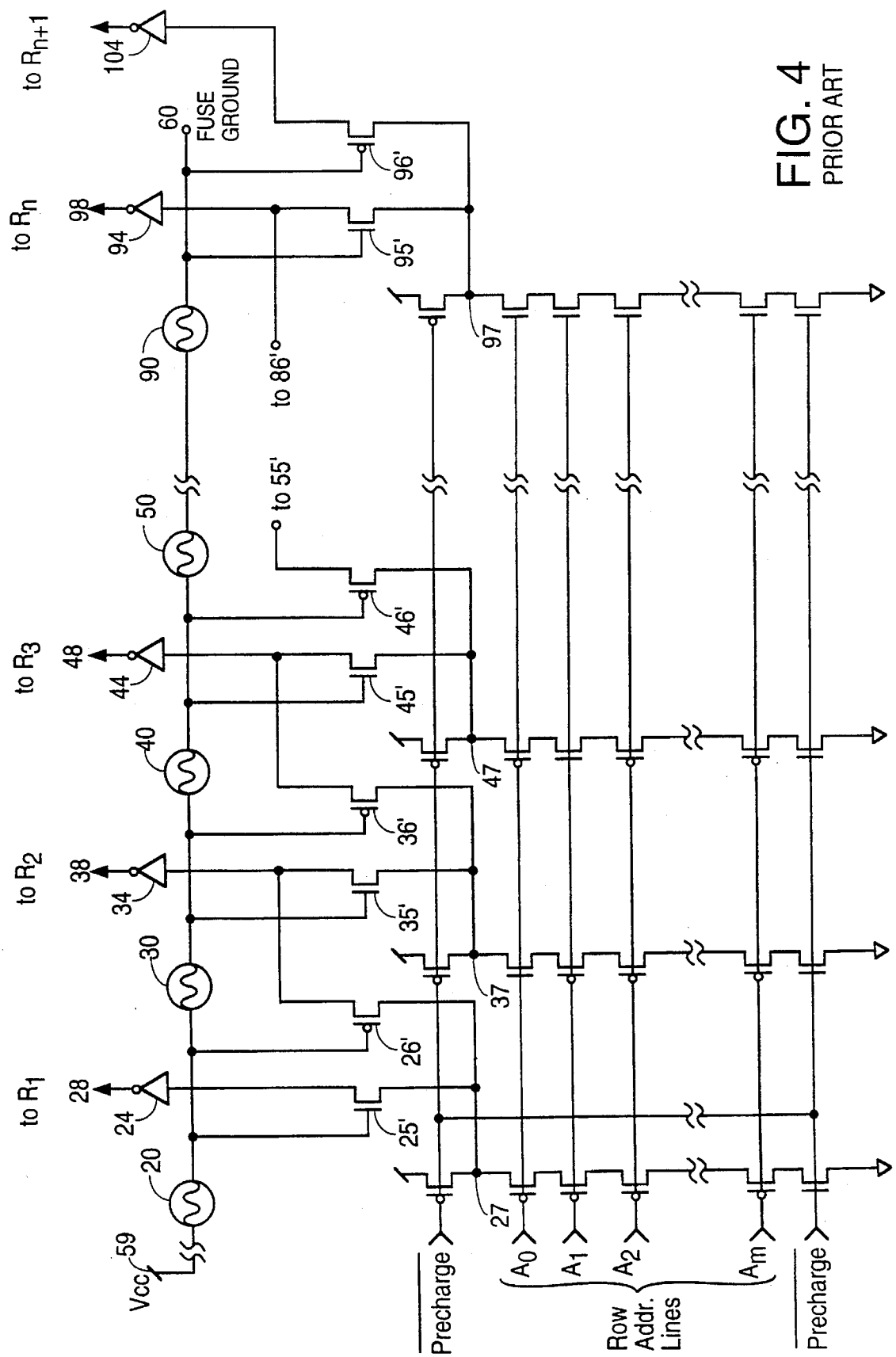
FIG. 4 (PRIOR ART) shows an adjacent row shift redundancy circuit having a resistive ladder of programmable fuses.
Figure 5:
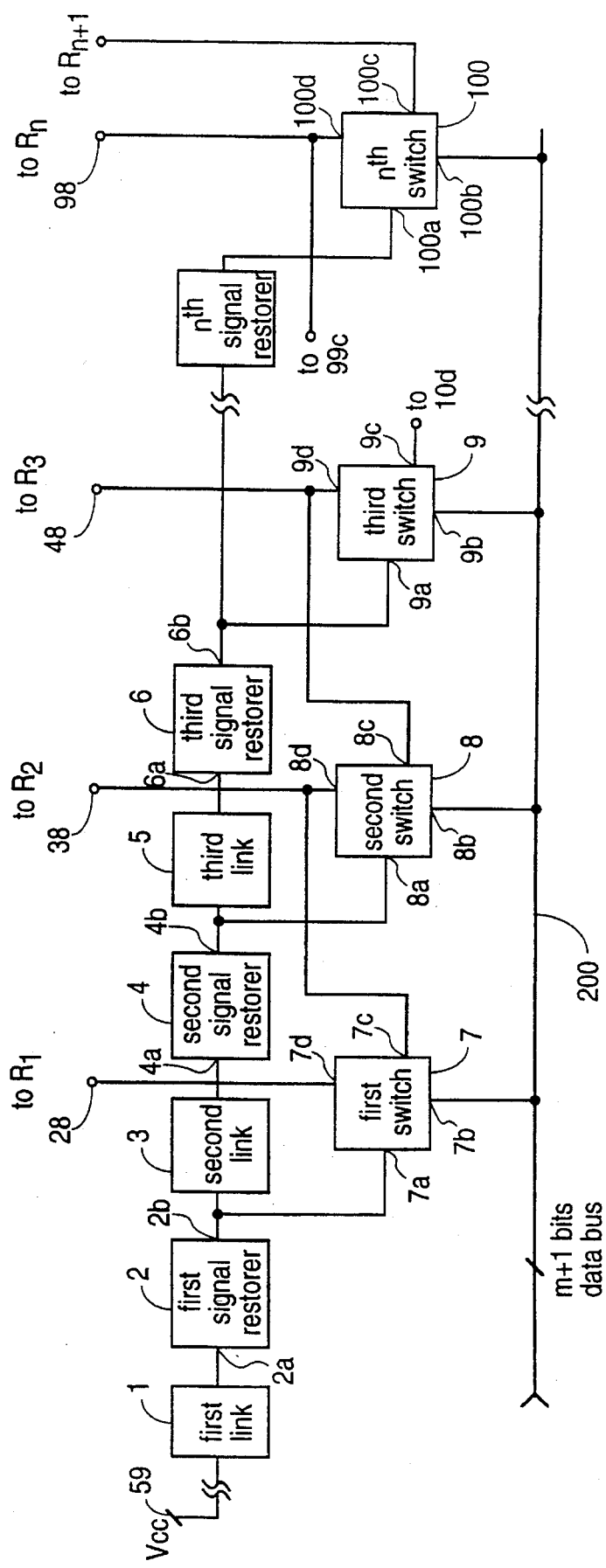
FIG. 5 shows a block diagram of an adjacent row shift redundancy circuit having programmable links and signal restorers coupled in series in accordance with the present invention.

In accordance with the invention, FIG. 5 shows a block diagram of an adjacent row shift redundancy circuit comprising a first row select output terminal 28, a second row select output terminal 38, and a third row select output terminal 48. A first programmable link 1, a first signal restorer 2, a second programmable link 3, and a second signal restorer 4 are coupled in series. The input terminal 2a of the first signal restorer 2 is coupled to the first programmable link 1, and the output terminal 2b of the first signal restorer 2 is coupled to the second programmable link 3. An input terminal 4a of the second signal restorer 4 is coupled to the second programmable link 3. A select input 7a of a first switch 7 is coupled to the output terminal 2b of the first signal restorer 2, a data input 7b is coupled to a data bus 200, a first data output terminal 7d is coupled to the first row select output terminal 28 and a second data output terminal 7c is coupled to the second row select output terminal 38. A select input terminal 8a of a second switch 8 is coupled to an output terminal 4b of the second signal restorer 4, a data input terminal 8b is coupled to the data bus 200, a first data output terminal 8d is coupled to the second row select output terminal 38, and a second data output terminal 8c is coupled to the third row select output terminal 48.

Figure 6:
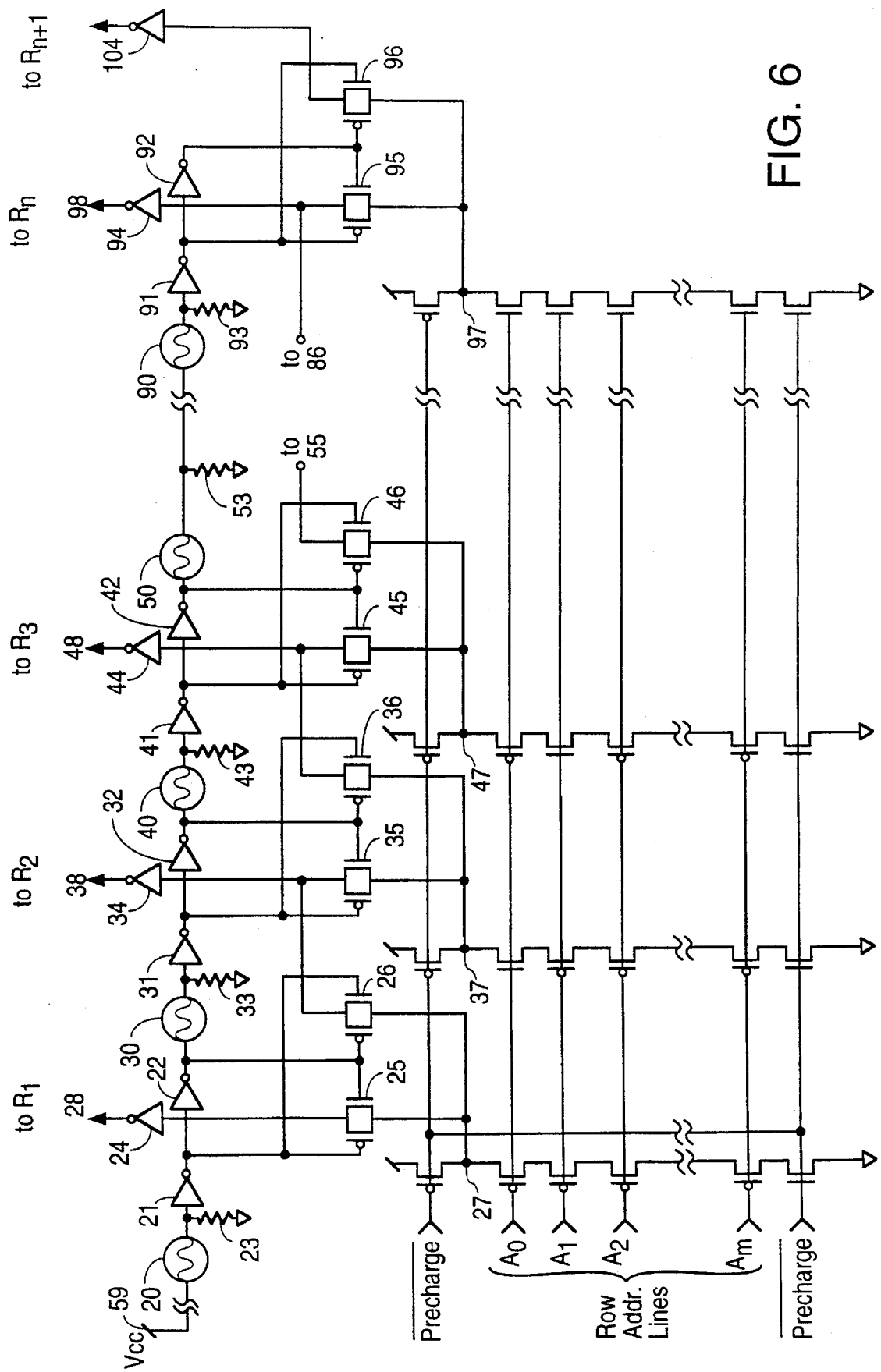
FIG. 6 shows a first embodiment of an adjacent row shift redundancy circuit having programmable links and signal restorers coupled in series in accordance with the present invention.

FIG. 6 shows a schematic diagram of a first implementation of the block diagram of FIG. 5 for selecting a first, second, third, fourth ... or $(n+1)^{th}$ row of memory cells $R_1$, $R_2$, $R_3$, $R_4$ (not shown), ... or $R_{n+1}$, and having a programmable resistive fuse ladder constructed in accordance with this invention. These fuses can be replaced with any other programmable elements that do not regenerate signal levels. Fuses 20, 30, 40, 50, ... and 90 form a resistive fuse ladder. Pairs of inverters 21 & 22, 31 & 32, 41 & 42, ... and 91 & 92 controlling the row squad multiplexing are coupled in series between the fuses 20, 30, 40, 50, ... and 90 respectively. These inverters 21, 22, 31, 32, 41, 42, ... 91 and 92 restore the signal integrity along the fuse line. High impedance resistors 23, 33, 43, 53, ... and 93 serve as pull-down resistors to avoid a floating node when one of the fuses 20, 30, 40, 50, ... or 90 is blown. These resistors can be formed using high impedance polysilicon, such as the second level polysilicon in a semiconductor process having multiple levels of polysilicon material. Although inverters are illustrated in FIG. 6, any logic element capable of restoring signal level, such as a NAND or NOR gate, can be used in place of the inverter. Any circuit element capable of performing a pull down function, such as a feedback N-channel transistor, can be used in place of the pull-down resistors.

When the memory device does not have any defective rows, i.e. memory rows $R_1$, $R_2$, $R_3$, ... $R_n$ are all operative, none of fuses 20, 30, 40, 50 and 90 will be blown. Because node 59 is coupled to a source of voltage Vcc, the output voltage levels of inverters 21, 31, 41, ... and 91 will be low and the output voltage levels of inverters 22, 32, 42, ... and 92 will be high. These voltage levels in turn will switch on transmission gates 25, 35, 45, ... and 95 and switch off transmission gates 26, 36, 46, ... and 96. Hence, input nodes 27, 37, 47, ... and 97 are now coupled via row select output terminals 28, 38, 48, ... and 98 to the memory rows $R_1$, $R_2$, $R_3$, ... and $R_n$ respectively.

In FIG. 6 which shows an example of the first embodiment of the invention, there is a total of 256 addressable rows requiring eight row address bit line i.e. $A_0, A_1, A_2, \ldots A_m$, wherein m=7. To couple input node 27 to memory row $R_1$, row address lines $A_0, A_1, A_2, \ldots$ and $A_7$ are each set low. To couple input node 37 to memory row $R_2$, all the row address lines except $A_0$ are set low. Similarly, to couple input node 47 to memory row $R_3$, all the row address line except $A_1$ are set low. Finally, to couple input node 97 to memory row $R_{256}$, all the row address lines are set high.

Although in this embodiment P-channel and N-channel transistors are used to decode the address, other embodiments use all N-channel transistors (with an appropriate inversion of the address signals).

If the second memory row $R_2$ connected to row select output terminal 38 is defective, fuse 30 is programmed or blown to bypass defective memory row $R_2$. This programming or blowing of the fuse 30 can be accomplished by using any known methods, including but not limited to laser cutting. The decode circuitry of memory row $R_1$ is not affected by blowing fuse 30. Accordingly, input select node 27 remains coupled to row select output terminal 28. Since fuse 30 is open, pull-down resistor 33 causes the output signal of inverter 31 to become logic high, thereby inverting the output signal of every inverter further down the fuse ladder. For example, the output signal of inverter 32 becomes low, the output signal of inverter 41 becomes high, the output signal of inverter 42 becomes low, and so on. Consequently, transmission gate 35 is turned off and transmission gate 36 is turned on. Accordingly, input select node 37 is no longer coupled to row select output terminal 38. Rather, node 37 is coupled to row select output terminal 48 via transmission gate 36.

Similarly, transmission gate 45 will be switched off and transmission gate 46 will be switched on, and input select node 47 is no longer coupled to row select output terminal 48 (coupled to memory row $R_3$). Instead, input select node 47 will now be coupled via transmission gate 46 to the next output select node (not shown) and to the next memory row $R_4$ (not shown).

As is readily apparent, this shift of input select nodes and output select nodes cascades down the chain. Accordingly, the first input select node 27 remains coupled to memory row $R_1$, defective memory row $R_2$ is no longer selectable, and input select nodes 37, 47, ... and 97 are coupled to memory rows $R_3, R_4, \ldots$ and $R_{n+1}$ respectively.

Figure 7:
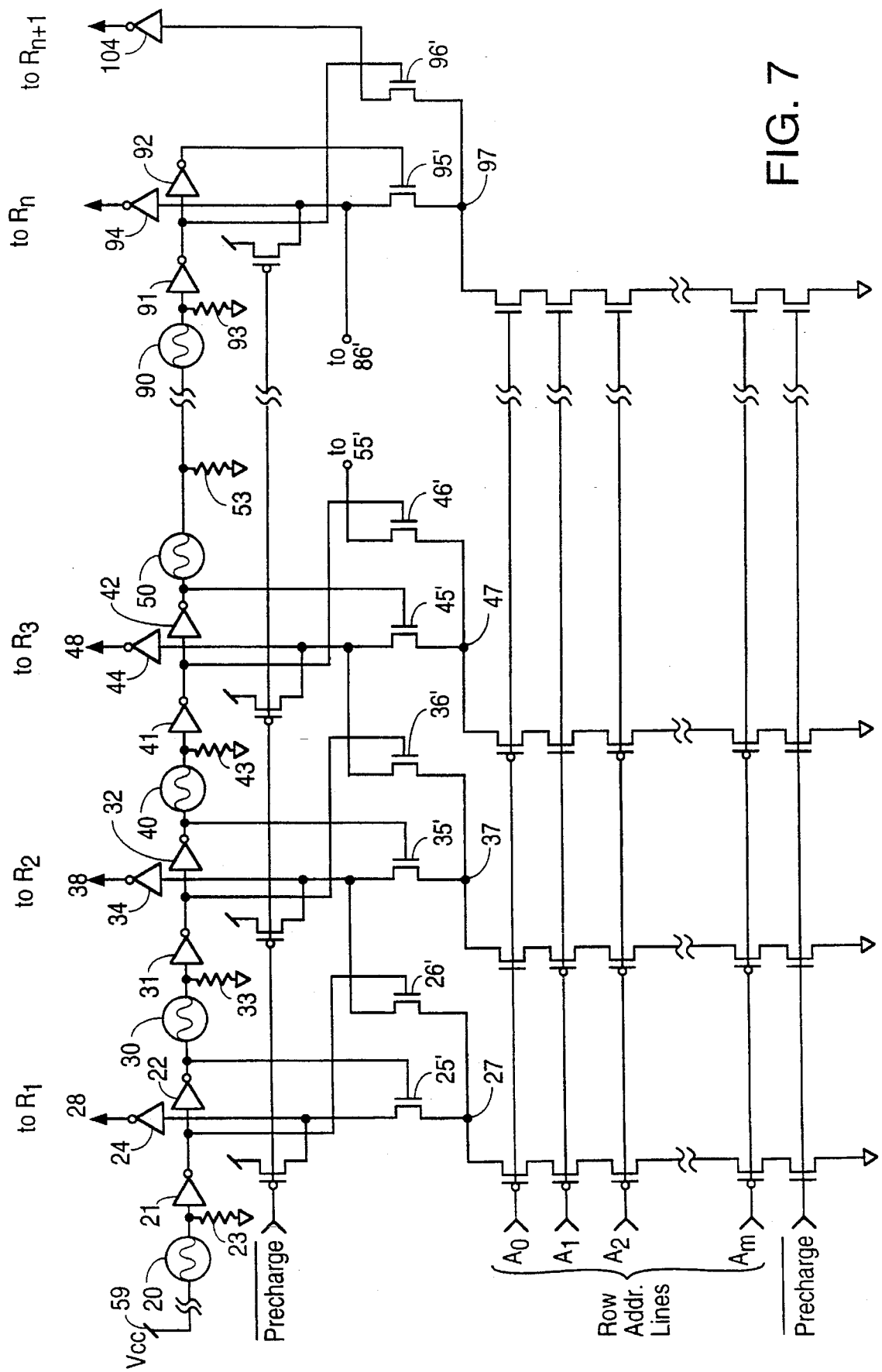
FIG. 7 shows a second embodiment of an adjacent row shift redundancy circuit having programmable links and signal restorers coupled in series, in which the redundancy selection and row decode are merged in accordance with the present invention.

FIG. 7 shows a second embodiment of an adjacent row shift redundancy circuit having programmable links and signal restorers coupled in series. Unlike the embodiment of FIG. 6, however, the redundancy selection and row decode circuitry are merged in the embodiment of FIG. 7. This embodiment is also capable of selecting a first, second, third, fourth, ... or $(n+1)^{th}$ row of memory cells $R_1, R_2, R_3, R_4$ (not shown), ... or $R_{n+1}$, and has a programmable resistive fuse ladder constructed in accordance with this invention.

As shown in FIG. 7, fuses 20, 30, 40, 50, ... and 90 form a resistive fuse ladder. Pairs of inverters 21 & 22, 31 & 32, 41 & 42, ... and 91 & 92 controlling the row squad multiplexing are coupled in series between the fuses 20, 30, 40, 50, ... and 90 respectively. These inverters 21, 22, 31, 32, 41, 42, ... 91 and 92 restore the signal integrity along the fuse line. High impedance resistors 23, 33, 43, 53, ... and 93 serve as pull-down resistors to avoid a floating node when one of the fuses 20, 30, 40, 50, ... or 90 is blown.

When the memory device does not have any defective rows, i.e. memory rows $R_1, R_2, R_3, \ldots$ and $R_n$ are all operative, none of fuses 20, 30, 40, 50, ... or 90 is blown. Because node 59 is coupled to Vcc, the output signals of inverters 21, 31, 41,... and 91 are low and the output signals of inverters 22, 32, 42, ... and 92 are high. Consequently, field effect transistors (FETs) 25', 35', 45', ... and 95' are on and FETs 26', 36', 46', ... and 96' are off. Hence, input nodes 27, 37, 47, ... and 97 are coupled via row select output terminals 28, 38, 48, ... and 98 to the memory rows $R_1, R_2, R_3, \ldots$ and $R_n$ respectively.

If the second memory row $R_2$ connected to row select output terminal 38 is defective, fuse 30 is blown to bypass defective memory row $R_2$. Since the decode circuitry of row $R_1$ is not affected by blowing fuse 30, input select node 27 remains coupled to row select output terminal 28. As fuse 30 is open, pull-down resistor 33 causes the output signal of inverter 31 to become logic high, which in turn inverts the output of every inverter further down the resistive fuse ladder. Consequently, the output signal of inverter 32 is at logic low, the output signal of inverter 41 is at logic high, the output signal of inverter 42 is at logic low, and so on. At the same time, FET 35' is turned off and FET 36' is turned on. Accordingly, input select node 37 is no longer coupled to row select output terminal 38. Rather, node 37 is coupled to row select output terminal 48 via FET 36'.

Similarly, FET 45' is switched off and FET 46' is switched on, and input select node 47 is no longer coupled to row select output terminal 48, which is coupled to memory row $R_3$. Instead, input select node 47 will now be coupled to the next row select output terminal (not shown) via FET 46' to the next memory row $R_4$ (not shown).

This shift of input select nodes and row select output terminals cascades down the chain. Accordingly, the first input select node 27 remains coupled to memory row $R_1$, defective memory row $R_2$ is no longer selectable, and input select nodes 37, 47, ... and 97 are coupled to memory rows $R_3, R_4$ (not shown), ... and $R_{n+1}$ respectively.

Figure 8:
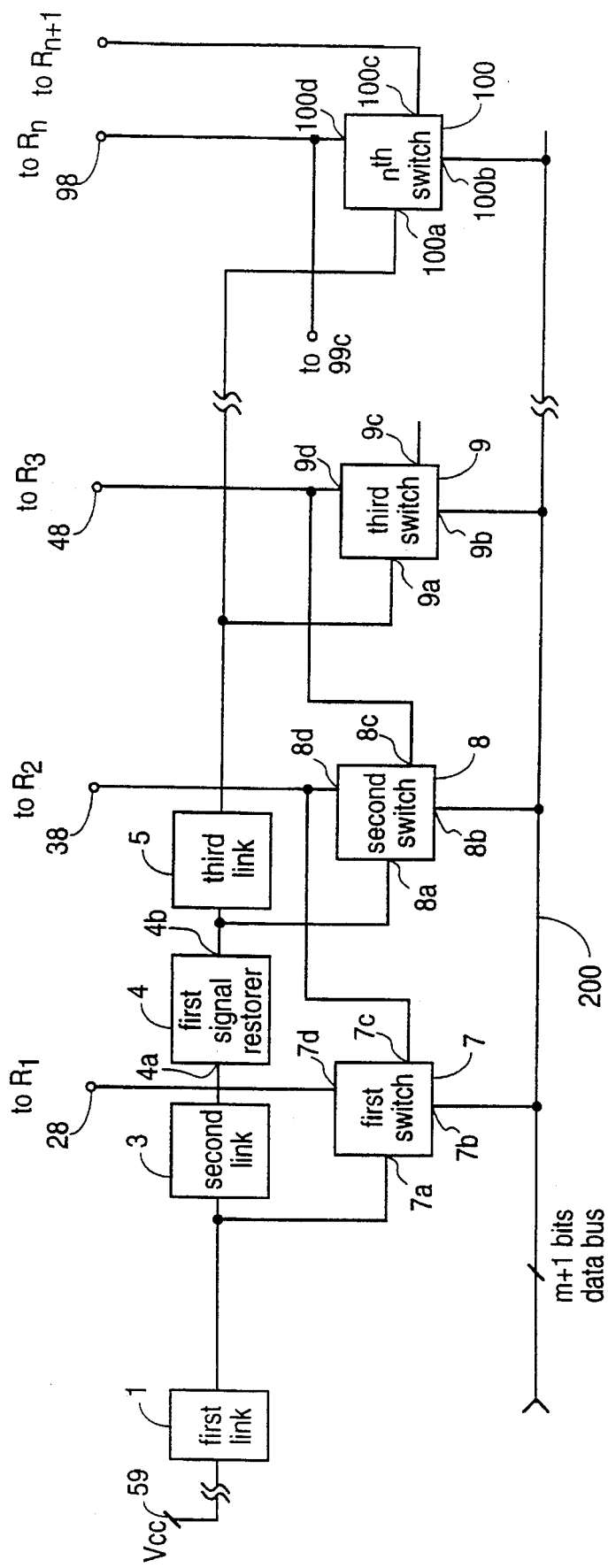
FIG. 8 shows a block diagram of a third embodiment of an adjacent row shift redundancy circuit having programmable links and a signal restorer coupled in series in accordance with the present invention.

FIG. 8 shows a block diagram of a third embodiment of an adjacent row shift redundancy circuit comprising a first row select output terminal 28, a second row select output terminal 38, and a third row select output terminal 48. Instead of inserting signal restorers between every programmable link, a signal restorer is inserted at predetermined intervals along the series of programmable links. As shown in FIG. 8, a first programmable link 1, a second programmable link 3, and a first signal restorer 4 are coupled in series, with the first programmable link 1 coupled to the second programmable link 3. An input terminal 4a of the first signal restorer 4 is coupled to the second programmable link 3. A select input terminal 7a of a first switch 7 is coupled to first programmable link 1, a data input terminal 7b is coupled to a data bus 200, a first data output terminal 7d is coupled to the first row select output terminal 28 and a second data output terminal 7c is coupled to the second row select output terminal 38. A select input terminal 8a of a second switch 8 is coupled to an output terminal 4b of the first signal restorer 4, a data input terminal 8b is coupled to the data bus 200, a first data output terminal 8d is coupled to the second row select output terminal 38, and a second data output terminal 8c is coupled to the third row select output terminal 48.

Figure 9:
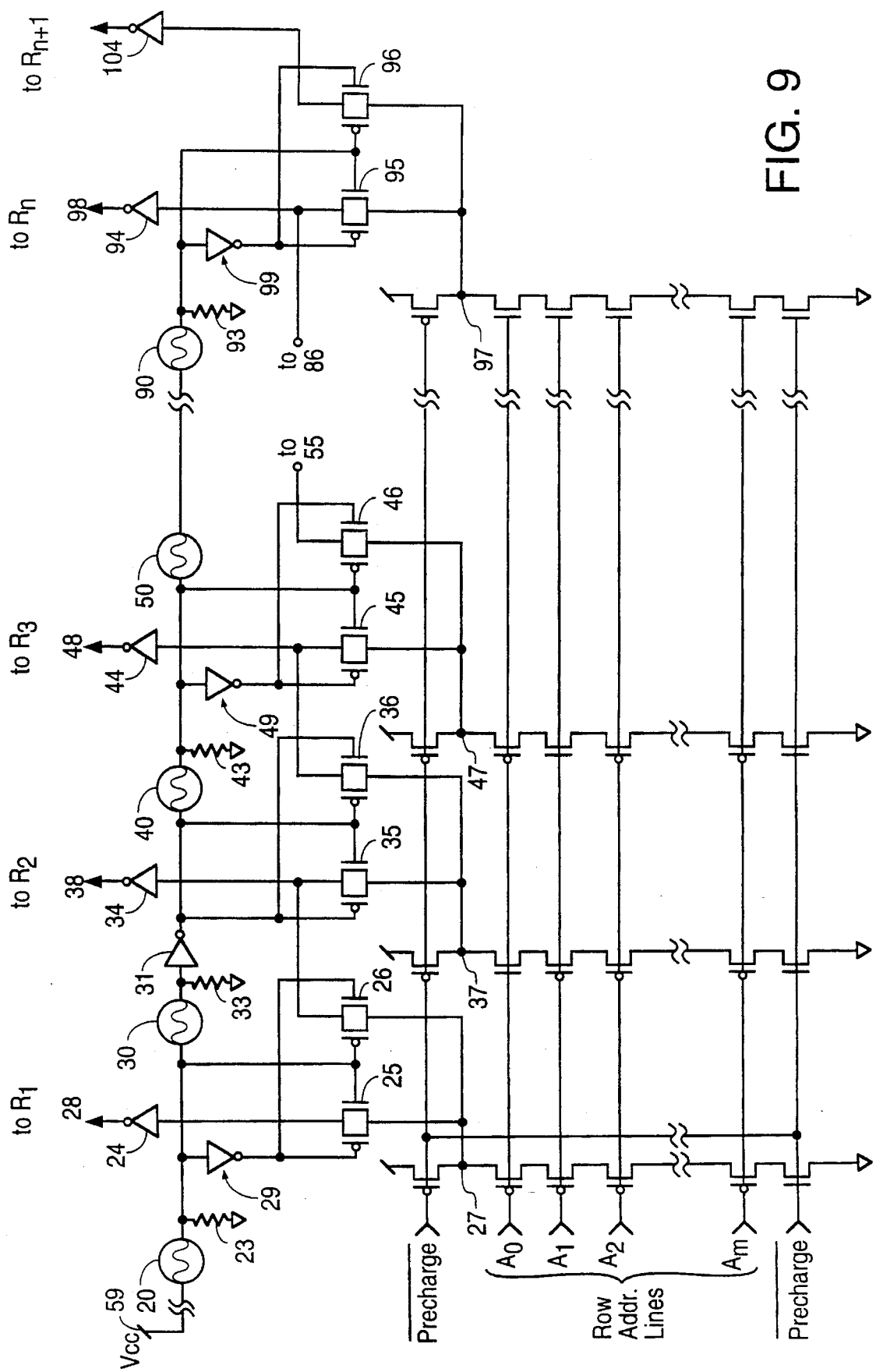
FIG. 9 shows a schematic diagram of the third embodiment of an adjacent row shift redundancy circuit having programmable links and a signal restorer coupled in series in accordance with the present invention.

FIG. 9 shows the schematic diagram of the third embodiment for selecting a first, second, third, fourth, ... and $(n+1)^{th}$ row of memory cells $R_1, R_2, R_3, R_4$ (not shown), ... and $R_{n+1}$ and having a programmable resistive fuse ladder constructed in accordance with this invention. Fuses 20, 30, 40, 50, ... and 90 form a resistive fuse ladder. A pair of inverters 31 & 32 is coupled in series between fuses 30 and 40. These inverters 31 and 32 restore the signal integrity of a portion of the fuse line. One of high impedance resistors 23, 33, 43, ... or 93 serves as a pull down resistor to avoid a floating node when one of fuses 20, 30, 40, ... or 90, respectively, is blown.

When the memory device does not have any defective rows, i.e. memory rows $R_1, R_2, R_3, \ldots$ and $R_n$ are all operative, none of fuses 20, 30, 40, 50, ... and 90 is blown. Because node 59 is coupled to Vcc, the output signals of inverters 29, 31, 49, ... and 99 are at logic low and the output signal of inverter 32 is at logic high, thereby switching transmission gates 25, 35, 45, ... and 95 on and transmission gates 26, 36, 46, ... and 96 off. Hence, input nodes 27, 37, 47, ... and 97 are coupled via row select output terminals 28, 38, 48, ... and 98, to memory rows $R_1, R_2, R_3, \ldots$ and $R_n$, respectively.

When, for example, the second memory row $R_2$ connected to row select output terminal 38 is defective, fuse 30 is blown to bypass defective memory row $R_2$. The decode circuitry of row $R_1$ is not affected by blowing fuse 30. Accordingly, input select node 27 remains coupled to row select output terminal 28. Since fuse 30 is blown, pull-down resistor 33 causes the output signal of inverter 31 to become logic high, thereby inverting the outputs of any inverters further down the fuse ladder, i.e. the output of inverter 32 is at logic low, and so on. At the same time, transmission gate 35 is turned off and transmission gate 36 is turned on. Accordingly, input select node 37 is no longer coupled to row select output terminal 38. Rather, node 37 is coupled to row select output terminal 48 via transmission gate 36.

Similarly, transmission gate 45 is switched off and transmission gate 46 is switched on, and input select node 47 is no longer coupled to row select output terminal 48 (coupled to memory row $R_3$). Instead, input select node 47 is now coupled to the next output select node (not shown) via transmission gate 46 to the next memory row $R_4$ (not shown).

This shift of input select nodes and output select nodes cascades down the chain. Accordingly, the first input select node 27 remains coupled to memory row $R_1$, defective memory row $R_2$ is no longer selectable, and input select nodes 37, 47, . . . and 97 are coupled to memory rows $R_3$, $R_4$, . . . and $R_{n+1}$, respectively.

Figure 10A:
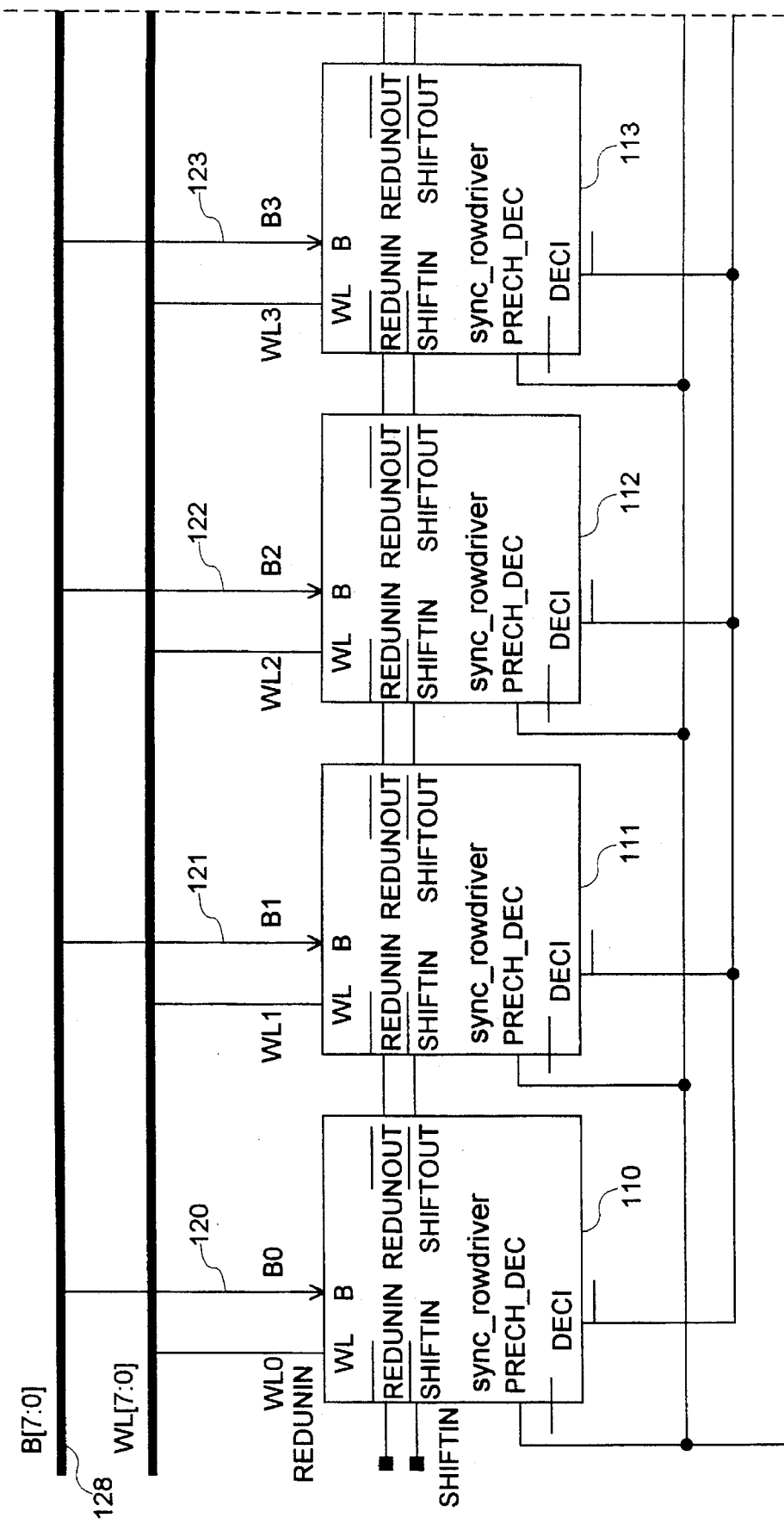
FIG. 10 is comprised of FIGS. 10A and 10B oriented as illustrated in the key to FIG. 10 shows a block diagram of another embodiment of an adjacent row shift redundancy circuit having programmable links and a signal restorer coupled in series in accordance with the present invention.
Figure 10B:
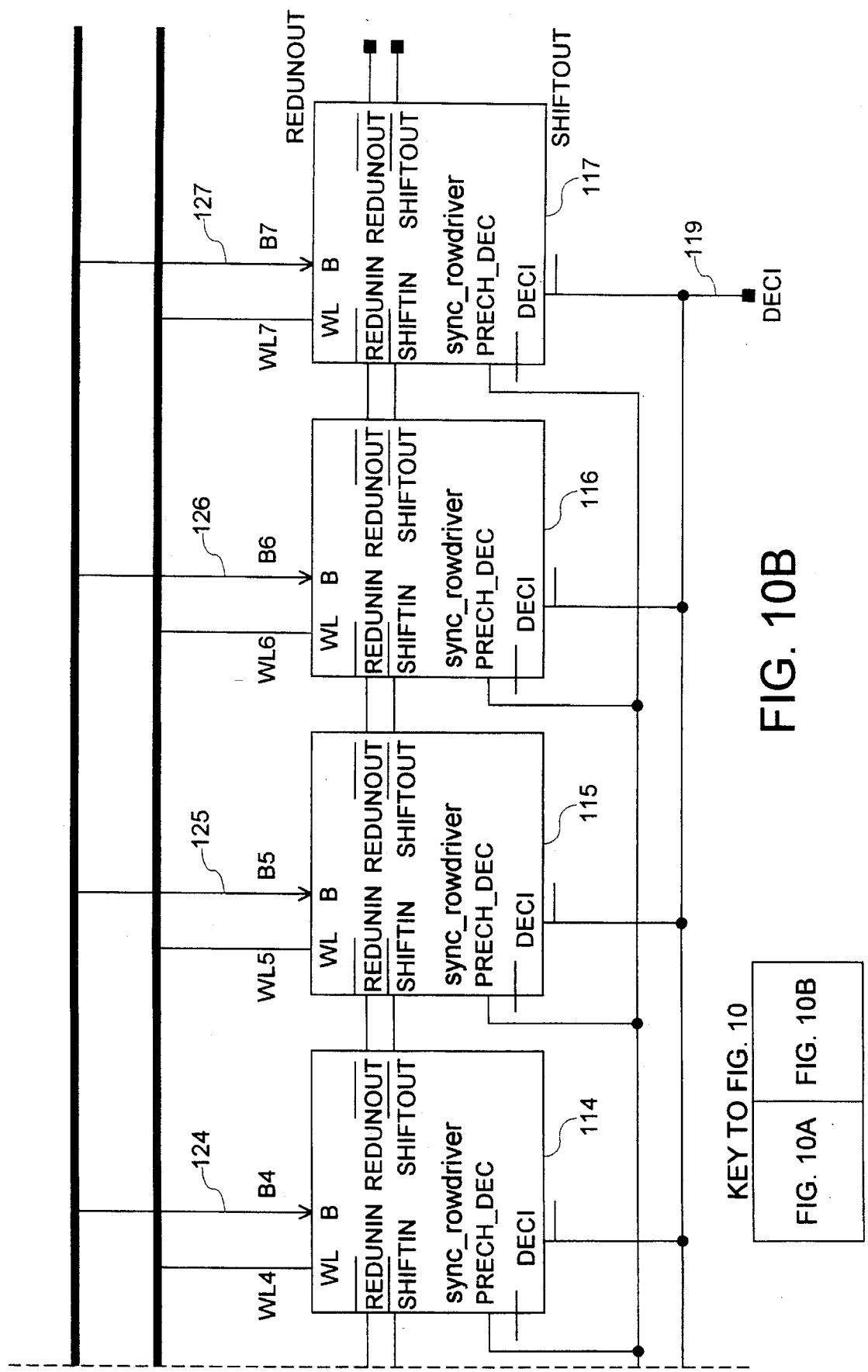

FIG. 10 shows a block diagram of another embodiment of the present invention. Substantially identical row drivers 110–117 illustrate part of a memory circuit which accesses eight memory rows or word lines. There are further groups of eight row drivers (not shown), substantially identical to row drivers 110–117, for accessing the other word lines in the memory. A decoder circuit (not shown) provides signals for accessing the word lines. In one application, this decoder circuit is a N-channel tree decoder.

The SHIFTIN and REDUNIN leads of each row driver 111–117 are coupled to the SHIFTOUT and REDUNOUT leads of the previous row driver, respectively. Word line WL0 is coupled to memory row $R_1$. The SHIFTIN lead of row driver 110 is not connected to another row driver, and the REDUNIN lead is coupled to a source of voltage Vcc. The SHIFTOUT lead of the last row driver (i.e., for memory row $R_{n+1}$) is not connected to another row driver, and the REDUNOUT lead is coupled to an inverter (corresponding to inverter 104 in FIG. 7) driving memory row $R_{n+1}$. Consequently, when a row is defective, the row driver driving the defective row may be bypassed (described below in conjunction with FIG. 11) by blowing a fuse in a manner similar to adjacent row redundancy circuits described above in conjunction with FIG. 7.

Further, each row driver receives a $\overline{\text{Precharge}}$ signal from a timing and control circuit (not shown) for decreasing the time needed to access the memory. In addition, row drivers 110–117 are each coupled to a DECI line 119, which carries a signal from a decoder circuit (not shown) to access row drivers 110–117 when the decoder circuit receives the appropriate address. Row drivers 110–117 are also respectively coupled to lines 120–127 of B-bus 128. When the signal on DECI line 119 selects row drivers 110–117, one of row drivers 110–117 is accessed by a signal on one of lines 120–127, respectively.

Figure 11A:
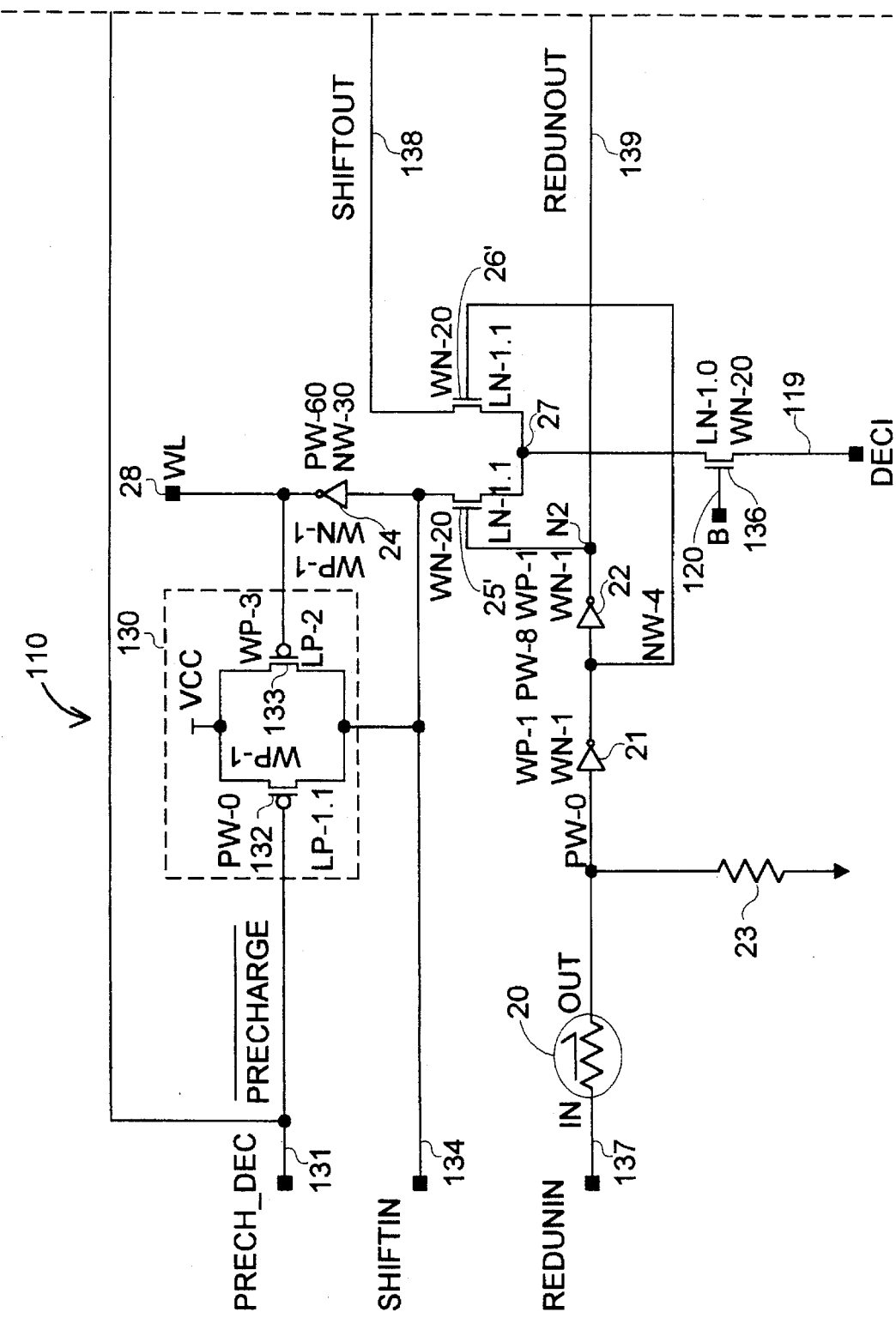
FIG. 11 is comprised of FIGS. 11A and 11B oriented as illustrated in the key to FIG. 11 shows a schematic diagram of a row driver depicted in the embodiment of FIG. 10.
Figure 11B:
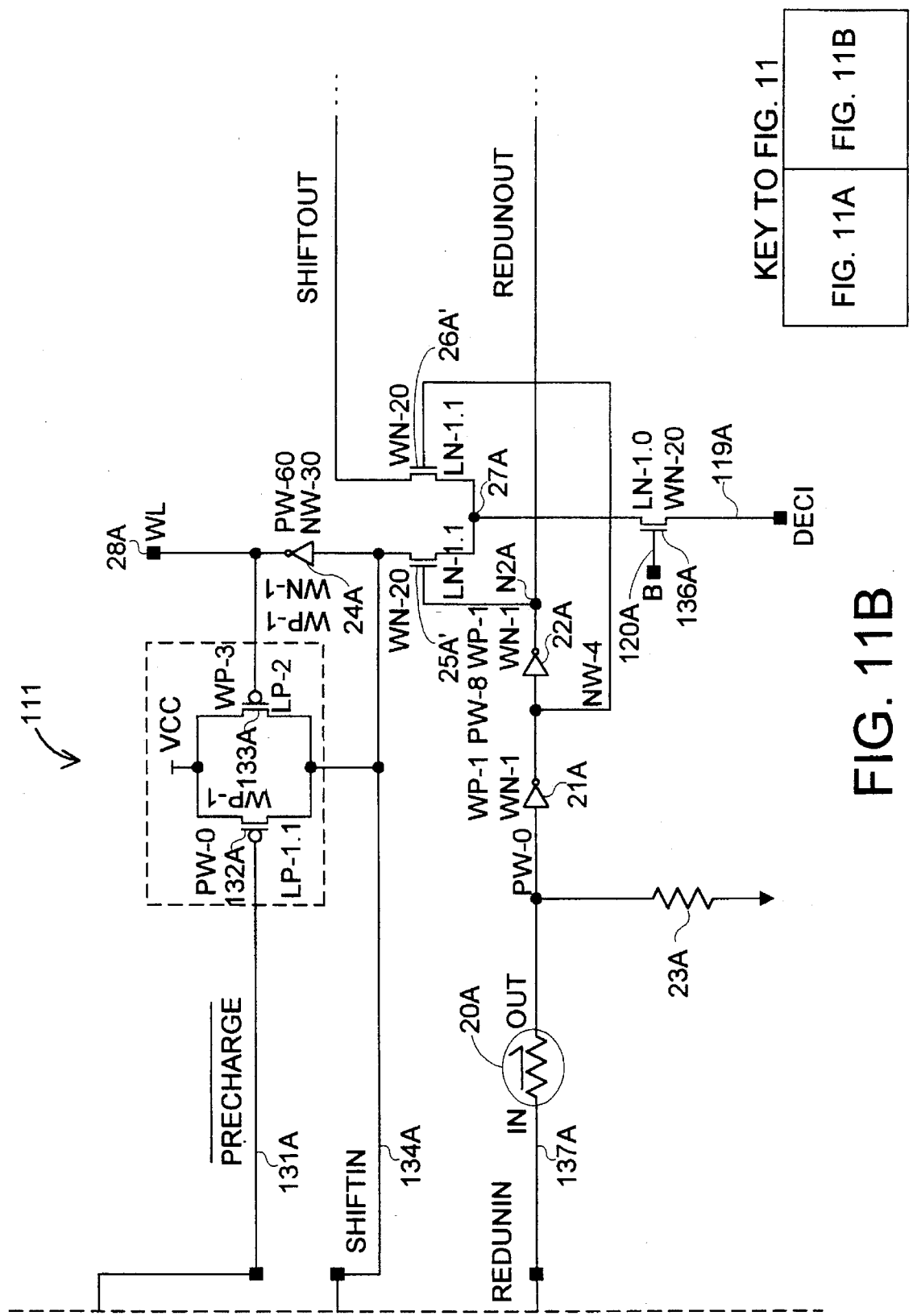

FIG. 11 shows a schematic diagram of row drivers 110 and 111. FIG. 11 also illustrates the circuitry of each of row drivers 112–117 (FIG. 10) with B line 120 being replaced with a corresponding one of B lines 121–127, as appropriate.

Row driver 110 is similar to one of the row driver circuits illustrated in FIG. 7, except that row driver 110 includes a latch circuit 130 instead of a precharge P-channel transistor and has a different decoder (with DECI line 119 and B line 120) instead of row address lines $A_0$–$A_m$.

PRECH_DEC line 131 is coupled to the gate of P-channel transistor 132 of latch 130 and carries the $\overline{\text{Precharge}}$ signal. Accordingly, at the start of each memory access, the $\overline{\text{Precharge}}$ signal is asserted (i.e., at a logic 0 level), causing transistor 132 to conduct. Because transistor 132 has its source coupled to voltage source Vcc and its drain coupled to SHIFTIN lead 134, the voltage at SHIFTIN lead 134 is pulled up to a logic 1 level. Inverter 24 has its input lead coupled to SHIFTIN lead 134, which causes inverter 24 to output a logic 0 signal, thereby deselecting row select output terminal 28 and memory row $R_1$. The gate of P-channel transistor 133 is electrically coupled to row select output terminal 28. Consequently, because the voltage of row select output terminal 28 is at a logic 0 level, transistor 133 becomes conductive. Transistor 133 has its source coupled to voltage source Vcc and its drain coupled to SHIFTIN lead 134. As a result, transistor 133 also pulls up SHIFTIN lead 134, thereby operating to latch the output of inverter 24 to a logic 0 level.

N-channel transistor 136 has its gate coupled to B line 120, its source coupled to DECI line 119, and its drain coupled to input select node 27 at the sources of N-channel transistors 25' and 26'. Thus, when the decoder circuit decodes an address that selects memory row $R_1$ (i.e., B line 120 is at a logic 1 level and DECI line 119 is at a logic 0 level), transistor 136 becomes conductive, thereby pulling down the voltage at input select node 27 to a logic 0 level.

In row driver 110, REDUNIN line 137 is coupled to voltage source Vcc. However, as stated above, each of the rest of the row drivers has its respective REDUNIN line coupled to the REDUNOUT line of the adjacent row driver driving the next higher row. Thus, when memory row $R_1$ is not defective, fuse 20 is intact and node N1 is at a logic 1 level. Inverter 21 has its input lead coupled to node N1, and thus outputs a logic 0 signal. The output lead of inverter 21 is coupled to the gate of transistor 26', thereby causing transistor 26' to be non-conductive. The voltage level of SHIFTOUT lead 138, which is connected to the SHIFTIN lead 134A of adjacent row driver circuit 111, remains at a logic 1 level due to the assertion of the $\overline{\text{Precharge}}$ signal in the latch circuit of adjacent row driver 111 at the start of the memory access, as described above.

The output lead of inverter 21 is also coupled to the input lead of inverter 22, thereby causing inverter 22 to output a logic 1 signal. The output lead of inverter 22 is coupled to node N2, which is coupled to the gate of transistor 25'. Thus, the gate of transistor 25' receives a logic 1 level, which causes transistor 25' to conduct. Because transistor 25' has its drain coupled to SHIFTIN lead 134 and is much larger than transistors 132 and 133, transistor 25' pulls down the voltage at SHIFTIN lead 134 to a logic 0 level. Consequently, inverter 24 outputs a logic 1 signal, thereby selecting row select output terminal 28 and memory row $R_1$. The output lead of inverter 22 is also coupled to REDUNOUT line 139 and, thus, REDUNOUT line 139 is also at a logic 1 level.

On the other hand, if memory row $R_1$ is defective, fuse 20 is blown as described above, thereby disconnecting node N1 from voltage source Vcc. However, node N1 is also coupled to a source of ground potential via pull-down resistor 23. As a result, the voltage on node N1 is pulled down to a logic 0 level, which causes inverter 21 to output a logic 1 signal to inverter 22 and the gate of transistor 26'. Consequently, transistor 26' becomes conductive. Further, inverter 22 outputs a logic 0 signal, thereby causing transistor 25' to be non-conductive. Because transistor 26' is much larger than transistor 133, when transistor 26' is conductive, the voltage on SHIFTOUT lead 138 is pulled down to a logic 0 level, causing the voltage on the SHIFTIN lead of adjacent row driver 111 to be at a logic 0 level. Further, because transistor 25' is non-conductive, the voltage of SHIFTIN lead 134 remains at a logic 1 level due to the assertion of the $\overline{\text{Precharge}}$ signal, as described above. As a result, input select node 27 is coupled to SHIFTOUT lead 138 and, thus, to the next memory row $R_2$ (i.e., word line WL1 in FIG. 10).

In addition, the logic 0 output signal from inverter 22 is transmitted to REDUNIN line 137A of adjacent row driver 111 via REDUNOUT line 139. As a result, transistors 25A' and 26A' in adjacent row driver 111 operate to couple and decouple the input select node 27A of adjacent row driver 111 to the SHIFTOUT lead 138 of row driver 110 and the row select output terminal 28A of adjacent row driver 111, respectively. This shift in input select nodes and row select output terminals cascades down the chain of row drivers.

While several embodiments of this invention have been described, this description is not intended to be limiting and other embodiments within the scope of the present invention are possible. Thus, while this invention has been described using a redundant row circuitry, the principles of this invention apply equally to the use of signal restorers in a chain of programmable links coupled in series in a semiconductor device.

We claim:

1. A semiconductor memory device comprising:

a first select output terminal;

a second select output terminal;

a third select output terminal;

a first programmable link having a first lead and a second lead;

a second programmable link having a first lead and a second lead;

a first signal restorer comprising an input terminal and an output terminal, the first signal restorer coupled in series between the first programmable link and the second programmable link, wherein the input terminal of the first signal restorer is coupled to the second lead of the first programmable link, and the output terminal of the first signal restorer is coupled to the first lead of the second programmable link;

a second signal restorer comprising an input terminal and an output terminal, wherein the input terminal of the second signal restorer is coupled to the second lead of the second programmable link;

a data bus;

a first switch comprising a data input terminal, a first select input terminal, a first data output terminal, and a second data output terminal, wherein the first select input terminal of the first switch is coupled to the output terminal of the first signal restorer, the data input terminal of the first switch is coupled to the data bus, the first data output terminal of the first switch is coupled to the first select output terminal, and the second data output terminal of the first switch is coupled to the second select output terminal;

a second switch comprising a data input terminal, a select input terminal, a first data output terminal, and a second data output terminal, wherein the select input terminal of the second switch is coupled to the output terminal of the second signal restorer, the data input terminal of the second switch is coupled to the data bus, the first data output terminal of the second switch is coupled to the second select output terminal, and the second data output terminal of the second switch is coupled to the third select output terminal; and a first latch coupled to the first data output terminal of said first switch and the first select output terminal.

2. The device of claim 1 wherein the latch comprises a field effect transistor having a gate coupled to the first select output terminal and a first end of a channel coupled to the first data output terminal of said first switch.

3. The device of claim 1 wherein the first and second programmable links are fuses.

4. The device of claim 1 wherein the first switch further comprises a second select input terminal coupled to a lead of the first signal restorer, wherein the lead of the first signal restorer is capable of transmitting an inverted version of a signal output by the first signal restorer at the output terminal of the first signal restorer.

5. The device of claim 1 wherein the first and second signal restorers comprise logic elements.

6. The device of claim 5 wherein the logic elements are inverters.

7. The device of claim 6 wherein each of the first and second signal restorers further comprises a pull-down element.

8. The device of claim 7 wherein the pull-down element is a resistor.

9. The device of claim 7 wherein the pull-down element is a feedback n-channel transistor.

10. The device of claim 1 wherein the device is a memory device having at least a first row, a second row and a third row of memory cells, wherein the first select output terminal, the second select output terminal and the third select output terminal of the device are coupled to the first row, the second row and the third row of memory cells respectively.

11. The device of claim 10 further comprising means for programming the programmable links.

12. A semiconductor memory device comprising:

a first select output terminal;

a second select output terminal;

a third select output terminal;

a first programmable link;

a second programmable link;

a signal restorer comprising an input terminal and an output terminal, wherein the input terminal of the signal restorer is coupled to the second programmable link;

a data bus;

a first switch comprising a data input terminal, a select input terminal, a first data output terminal, and a second data output terminal, wherein the select input terminal of the first switch is coupled to the first programmable link, the data input terminal of the first switch is coupled to the data bus, the first data output terminal of the first switch is coupled to the first select output terminal, and the second data output terminal of the first switch is coupled to the second select output terminal;

a second switch comprising a data input terminal, a select input terminal, a first data output terminal, and a second data output terminal, wherein the select input terminal of the second switch is coupled to the output terminal of the signal restorer, the data input terminal of the second switch is coupled to the data bus, the first data output terminal of the second switch is coupled to the second select output terminal, and the second data output terminal of the second switch is coupled to the third select output terminal; and a first latch coupled to the first data output terminal of said first switch and the first select output terminal.

13. The device of claim 12 wherein the latch comprises a field effect transistor having a gate coupled to the first select output terminal and a first end of a channel coupled to the first data output terminal of said first switch.

14. The device of claim 12 wherein the first and second programmable links are fuses.

15. The device of claim 12 wherein the first switch further comprises a second select input terminal coupled to a lead of the first signal restorer, wherein the lead of the first signal restorer is capable of transmitting an inverted version of a signal output by the first signal restorer at the output terminal of the first signal restorer.

16. The device of claim 12 wherein the signal restorer comprises logic elements.

17. The device of claim 16 wherein the logic elements are inverters.

18. The device of claim 17 wherein the signal restorer further comprises a pull-down element.

19. The device of claim 18 wherein the pull-down element is a resistor.

20. The device of claim 18 wherein the pull-down element is a feedback n-channel transistor.

21. The device of claim 12 wherein the device is a memory device having at least a first row, a second row and a third row of memory cells, wherein the first select output terminal, the second select output terminal and the third select output terminal of the device are coupled to the first row, the second row and the third row of memory cells respectively.

22. The device of claim 21 further comprising means for programming the links.

23. A semiconductor memory device having a first row of memory cells, a second row of memory cells, and a third row of memory cells, the device comprising:

- a first select output terminal coupled to the first row of memory cells;
- a second select output terminal coupled to the second row of memory cells;
- a third select output terminal coupled to the third row of memory cells;
- a first programmable link having a first lead and a second lead;
- a second programmable link having a first lead and a second lead;
- a first means for restoring comprising an input terminal and an output terminal, the first means for restoring coupled in series between the first programmable link and the second programmable link, wherein the input terminal of the first means for restoring is coupled to the second lead of the first programmable link, and the output terminal of the first means for restoring is coupled to the first lead of the second programmable link;
- a second means for restoring comprising an input terminal and an output terminal, wherein the input terminal of the second means for restoring is coupled to the second lead of the second programmable link;
- a data bus;
- a first means for switching comprising a data input terminal, a first select input terminal, a first data output terminal, and a second data output terminal, wherein the first select input terminal of the first means for switching is coupled to the output terminal of the first means for restoring, the data input terminal of the first means for switching is coupled to the data bus, the first data output terminal of the first means for switching is coupled to the first select output terminal, and the second data output terminal of the first means for switching is coupled to the second select output terminal;
- a second means for switching comprising a data input terminal, a select input terminal, a first data output terminal, and a second data output terminal, wherein the select input terminal of the second means for switching is coupled to the output terminal of the second means for restoring, the data input terminal of the second means for switching is coupled to the data bus, the first data output terminal of the second means for switching is coupled to the second select output terminal, and the second data output terminal of the second means for switching is coupled to the third select output terminal; and
- a first means, coupled to the first data output terminal of said first means for switching and the first select output terminal, for latching an output signal generated at the first data output terminal.

* * * * *